DIFFUSION PROCESS AND APPARATUS

Filed Jan. 22, 1962

INVENTORS
James E. Reynolds
Kenneth D. Holloway
BY
Mueller & Aichele
ATT'YS.

United States Patent Office 3,183,130

Patented May 11, 1965

3,183,130

DIFFUSION PROCESS AND APPARATUS

James E. Reynolds, Phoenix, and Kenneth D. Holloway, Scottsdale, Ariz., assignors to Motorola, Inc., Chicago, Ill., a corporation of Illinois Filed Jan. 22, 1962, Ser. No. 167,815
6 Claims. (Cl. 148—188)

This invention relates to the processing of semiconductor material to introduce doping impurities into that material by solid state diffusion. In particular, the invention relates to a method for simultaneously diffusing two types of impurities into a large number of semiconductor wafers in a single diffusion step, and to apparatus for accomplishing the method on a mass production basis while maintaining high standards of product uniformity and quality.

Diffusion processing, as it has typically been carried out in the semiconductor industry, is a batch-type of process in which a number of wafers of semiconductor material are heated at an elevated temperature for a period of time which is sufficient to cause doping impurity material to diffuse into the wafers without melting the semiconductor material. The diffusion furnace is often in the form of a horizontally extending quartz tube which has a heating element positioned around it. The wafers are typically placed on a carrier, known as a "boat," and the carrier with the wafers on it is pushed into the hot zone of the furnace where the wafers are heated for a time required to accomplish the diffusion.

In some diffusion processes the impurity material is provided in the form of vapors in the atmosphere within the furnace, and in other processes the impurity material is applied to the surfaces of the semiconductor wafers before they are put into the furnace. In either case, the number of wafers which can be processed in a single diffusion run is limited by the size of the temperature controlled zone in the furnace. That zone must be maintained at a selected temperature with a maximum variation determined by the maximum permissible variation in diffusion depth. Adequate teperature control can be accomplished effectively only in a limited space, and this limits the size of the diffusion furnace and the number of wafers which can be processed at one time in a given furnace. Vertical stacks of wafers placed in a horizontal furnace ordinarily do not fill the entire temperature controlled zone, so some space in the furnace is wasted. All of these factors have tended to hold down the production output from diffusion processing at levels lower than those desired to meet mass production schedules for semiconductor devices.

Diffusion processing of the type in which two different impurity materials are coated on opposite sides of the wafers before they are placed in a diffusion furnace has been applied successfully to the fabrication of wafers for semiconductor rectifiers and diodes. In such processing, it is possible for impurity material of one type to become mixed with impurity material of the opposite type during the diffusion heating, resulting in a certain amount of cross contamination of the diffused regions. This can have several adverse effects, as will be further explained, and it is highly desirable to minimize cross contamination of the diffused regions.

Accordingly, it is an object of this invention to increase the production output rate which can be obtained from diffusion processing of semiconductor wafers while keeping the yield of commercially acceptable wafers at a high level.

Another object of the invention is to provide an improved diffusion system in which a larger number of semiconductor wafers can be processed simultaneously as compared to known systems of the same size.

A further object of the invention is to reduce or eliminate cross contamination of diffused regions in a diffusion process of the type in which semiconductor wafers are coated on their major sides with two different impurity materials.

A feature of the invention is a diffusion method and an apparatus for accomplishing it in which semiconductor wafers are stacked in a diffusion tube which has a series of ribs or ridges spaced about its inner surface, with the ribs serving to support the wafers at their edge portions while allowing space between the ribs for gas to flow uniformly through the diffusion furnace. The entire temperature controlled zone can be filled with wafers, thus increasing the number of wafers that can be processed in a single run.

Another feature of the invention is the restricting of gas flow to the spaces between the ribs or ridges on the interior of the diffusion tube just referred to so as to increase the flushing action of the gas at the edges of the wafers, thereby reducing cross contamination of the wafers.

A further feature of the invention is the provision of a diffusion method and a diffusion tube in which wafers are arranged in a stack which extends along the length of the tube so that they nearly fill the temperature controlled zone of the diffusion system, and the method of loading the tube in which all of the wafers are placed in the tube simultaneously as a single stack, thus keeping loading time at a minimum to speed up the over-all diffusion operation.

The invention is illustrated in the accompanying drawings in which.

Figure 3:
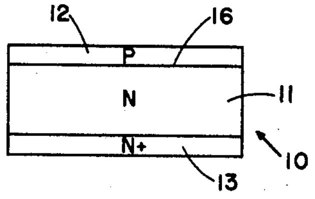
FIG. 3 is an enlarged sectional view of a typical semiconductor wafer which has been diffused using the apparatus and method of the invention.

An example of a semiconductor 10 which has been diffused successfully by the process of the invention is shown in FIG. 3. The scale in the vertical direction has been greatly enlarged in order to show clearly the various conductivity zones within the wafer. The illustrated wafer has a P-type diffused zone 12 of low resistivity on one side and an N-type diffused zone 13 of low resistivity on the other side. The intermediate zone is N-type in this particular wafer, and has a higher resistivity value than either of the two outer zones 12 and 13. Consequently, the outer zone 13 is designated N+ in order to distinguish it from the intermediate zone 11. It will be understood that the intermediate zone 11 may be of P-type material, and in this case the outer zone 12 may be designated P+. For most applications the PNN+ structure is preferred over the NPP+ structure. In either case, the P-type zone 12 is formed by diffusing boron into the wafer, and the N-type zone 13 is formed by diffusing phosphorous into the wafer. The structure of the wafer 10 is known in the art and forms no part of the present invention.

Figure 4:
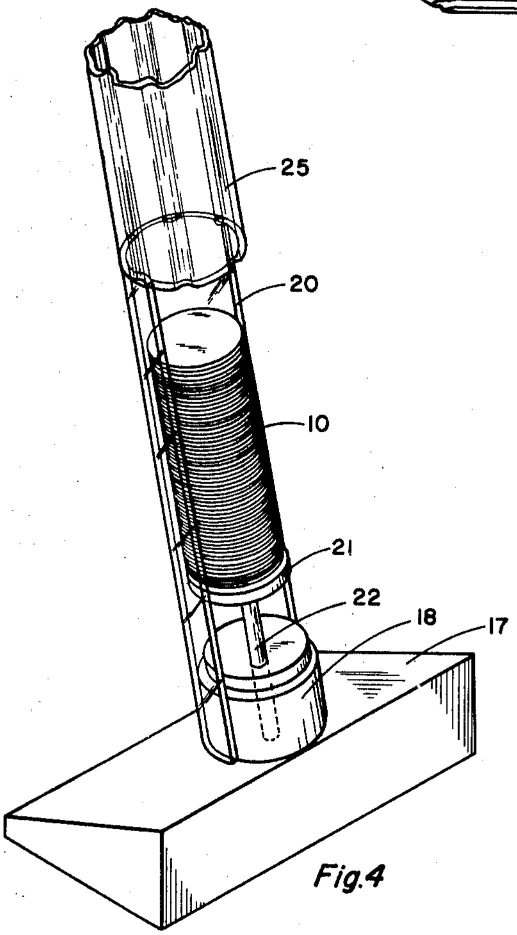
FIG. 4 is a perspective view of the apparatus for accomplishing both the stacking of the wafers and the inserting of the stack of wafers into the ribbed diffusion tube.

The entire process of preparing the semi-conductor wafers for diffusion, the diffusion step, and the steps immediately following diffusion will be described with reference to FIGS. 1, 2 and 4. For purposes of illustration, the process will be described as it is applied to N-type starting material, but it will be understood that the starting material may be P-type. Wafers of N-type monocrystalline silicon material, having a diameter of approximately 1⅛" and a thickness of about 9 mils, which have been lapped smoothed and which have reasonably parallel major faces, are thoroughly cleaned by immersing them in hot trichloroethylene vapor and liquid. The wafers are washed in deionized water in beakers in an ultrasonic tank, dried, and then soaked for approximately two minutes in hydrofluoric acid. After further rinsing and drying of the wafers, they are ready to be coated with liquids which contain phosphorus and boron impurities.

A thin coat of a phosphorous pentoxide contained in an organic solution is painted on one face of each of the wafers, and the wafers are allowed to dry. They are then turned over, and a thin coating of a boron trioxide contained in an organic solution is painted on the other face of each of the wafers. After drying, a small quantity of powdered alumina is sprinkled over the boron coated side of the wafer to prevent sticking, and the wafers are stacked in pairs so that the boron sides are together.

After all the wafers have been put in pairs, they are ready to be placed in one large stack. This is done utilizing the loading apparatus shown in FIG. 4. The loading apparatus includes a base 17, a pedestal 18, and a wafer holder 20. The pedestal 18 and the holder 20 are secured rigidly to the base 17. A rod or handle 22 projects upward from the pedestal 18, and it supports a platform 21 on which the wafers 10 are stacked. The rod 22 is received in a recess in the pedestal 18. The platform 21 is inclined at approximately 15 degrees from a horizontal plane. The previously stacked pairs of wafers are arranged in a single stack on the platform 21 so that the phosphorous coated sides of the wafers are together. Using this means of stacking, approximately 100 wafers per inch can be stacked, and typically the stacks are 6 to 8 inches high.

After the stacking of the wafer is completed, the ribbed diffusion tube 25 is brought into position over the wafer loading apparatus and the wafers are pushed into this tube. The entire ribbed diffusion tube 25 is shown in FIG. 2. It is generally cylindrical and may be made of quartz. The tube has a hollow extension 26 at its left-hand end which forms an inlet for gas. There are six interior ribs 27 extending along the length of the tube. The inside diameter of the tube 25, measured to the longitudinal ribs, is only slightly larger than the largest diameter semiconductor wafer which is normally encountered.

Referring again to FIG. 4, when it is desired to load the entire stack of wafers 10 into the tube 25, the tube is moved into position over the stack of wafers as shown. An operator grasps the central rod 22, and pushes the stack of wafers into the tube until the top wafer touches the uppermost end of the tube. The tube is then moved into a horizontal position, the loading apparatus is removed from the tube, and the wafers 10 stand on edge inside the tube resting on the ribs or ridges 27. A quartz end plug 29 (FIG. 1) is then pushed into the open end of the tube and placed against the wafers. This end plug aids in maintaining the wafers in a position approximately perpendicular to the axis of the tube and keeps them from collapsing during subsequent handling. The plug has openings in it which allows gas to flow out of the tube 25.

Figure 1:
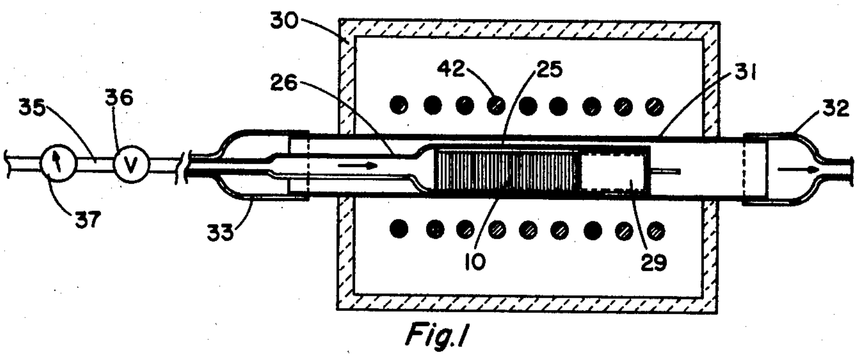
FIG. 1 is a sectional view of a diffusion system in accordance with the invention.
Figure 2:
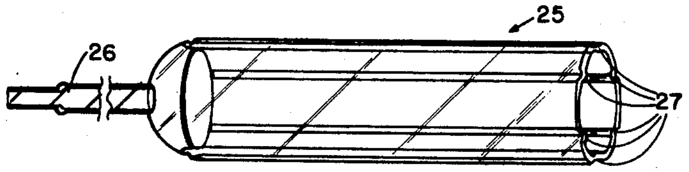
FIG. 2 is a perspective view of a ribbed diffusion tube included in the system of FIG. 1.

The diffusion furnace shown in FIG. 1 includes a housing 30, an outer furnace tube 31 which may be made of quartz, and a heating coil 42 surrounding the tube 31. There are end bells 32 and 33 at each end of the tube 31. The furnace has a gas line 35 with an inlet valve 36 and a flow meter 37. The heated zone of the furnace within the heating coil 42 is maintained at a temperature of about 1300°. When it is desired to place wafers in the furnace, the end bell 33 is removed and the ribbed diffusion tube 25, containing the wafers standing on edge and held in position by the end plug 29, is inserted into the furnace tube 31. The tube 25 is positioned so that it is within the temperature controlled zone of the furnace.

The gas inlet 26 is connected to the gas line 35, which carries a suitable flushing gas such as oxygen. The valve 36 is adjusted to provide a gas flow of approximately 500 cc./minute into the diffusion tube. The diffusion heating operation is then permitted to proceed with the furnace temperature held at approximately 1300° C. The time of diffusion is dependent upon the depth of the diffused regions that are desired.

Since the gas flow is mainly restricted to the passages between the ribs 27, the flow rate of the gas passing over the wafer edges is increased for a given quantity of gas flowing per unit time as compared to previously known processes. The greater quantity of gas flowing near the wafer edges has a stronger flushing action and sweeps out excess impurities escaping from between the wafers, thus minimizing cross contamination. Cross contamination is defined as the phenomenon associated with diffusion in any physical state in which one impurity travels from its position between two wafers, out and around the wafer edge and into the wafer area intended to be dominated entirely by a different type impurity. Such diffusion may take place in the vapor phase or may be due to migration of impurities in solid or liquid substances at the edges of the wafers. The action of the flushing gas in sweeping impurity vapors away from the edges of the wafers automatically increases the rate of vaporization of impurities at the wafer edges. The increased vaporization in turn reduces the chance for impurities to diffuse in solid or liquid phase materials at the edges of the wafers. Cross contamination can result in a lowering of the resistivity in the diffused layer by partial overdoping of one impurity by the other, and in severe cases, the formation of undesired structures by completely swamping out and over-doping the desired impurity element. This results in wafers having erratic breakdown behavior, "soft" junctions, and otherwise undesired and uncontrollable properties. Lower yields of acceptable products result, and hence, cross contamination is undesirable.

When the diffusion run has been completed, the tube 25 is pulled out of the hot zone of the furnace.. The end bell 33 is removed and the tube 25 is pulled entirely out of the main furnace tube 31. The tube 25 is placed on a work table, the end plug 29 is removed, and the diffused wafers are permitted to slide from the tube by gently tilting the tube. The wafers are separated with tweezers, placed in suitable containers of acid-resistant material, and soaked in hydrofluoric acid for approximately 4 hours. They are then rinsed, dried, and are ready for further processing. Ultimately each wafer is divided into many smaller units known as dice which are provided in diode devices such as rectifiers or Zener diodes.

The apparatus and method of the invention permits a production output rate of diffused wafers which is at least ten times greater than production outputs of related prior art methods. The wafers being diffused are stacked so that they nearly fill the tube across its inside diameter. Thus, gas flow is restricted to a small space at the edges of the wafers, and this minimizes cross contamination of the diffused regions, giving a better yield of usable diffused wafers.

We claim:

1. A process for diffusing a first impurity into one side of each of a plurality of wafers and for diffusing a different second impurity into the opposite side of each of said wafers, with each of said wafers having a first thin layer of material containing said first impurity placed on one of said sides and having a second thin layer containing said second impurity placed on the other of said sides prior to the diffusion step, said process comprising:

(*a*) arranging said coated wafers in a stack extending longitudinally of a diffusion tube on the inside thereof so that each pair of adjacent wafers in said stack has the coatings containing the same impurity material in contact with each other, (*b*) supporting said wafers in said tube at the edge portions thereof while leaving a restricted space about the circumference of said wafers in said tube for gas to flow through said tube past the edges of said wafers, (*c*) and subjecting said wafers to heat in said tube while passing flushing gas through said restricted space about said wafers so that said impurities diffuse into said wafers and said flushing gas sweeps away any impurity vapors emanating from the edges of said wafers to minimize cross contamination of said wafers.

2. A process for treating a plurality of semiconductor wafers to diffuse an acceptor doping impurity into one side of each wafer and to diffuse a donor doping impurity into the other side of each wafer, which process comprises:

(*a*) forming first and second impurity bearing layers respectively on first and second sides of each of said wafers, with said first layer containing the acceptor doping impurity on said first side and said second layer containing the donor doping impurity on said second side such that said layers are adapted to serve as sources of said impurities in a diffusion step, (*b*) placing said wafers in a diffusion tube and arranging said wafers in a stack extending longitudinally of said tube, with each pair of adjacent wafers in the stack thereof having the layers which contain the same impurity material in contact with each other, (*c*) and passing flushing gas through a restricted flow path in said tube which adjoins and extends about the edges of said wafers while subjecting said wafers to heat in said tube so as to diffuse said impurities from said layers into said wafers with said flushing gas acting to sweep impurity vapors away from the edges of said wafers.

3. A process for treating a plurality of semiconductor wafers to diffuse acceptor doping impurity into one side of each wafer and to diffuse donor doping impurity into the other side of each wafer, which process comprises:

(*a*) forming first and second impurity bearing layers respectively on first and second sides of said wafers, with said first layer containing the acceptor doping impurity on said first side and said second layer containing the donor doping impurity on said second side such that said layers are adapted to serve as sources of said impurities in a diffusion step, (*b*) arranging said wafers in a stack in a diffusion tube which stack extends longitudinally of said tube and has each pair of adjacent wafers positioned such that the layers thereon which contain the same impurity materials are in contact with each other, (*c*) said diffusion tube having means therein which supports said wafers at the edge portions thereof and having flow paths extending longitudinally of said tube for gas to flow through said tube in contact with the edges of said wafers, (*d*) and passing flushing gas through said flow paths in said tube while subjecting said wafers to heat in said tube to diffuse said impurities from said layers into said wafers with said flushing gas acting to sweep impurity vapors away from the edges of said wafers.

4. A process for diffusing acceptor impurity material into one side of each of a plurality of semiconductor wafers and for diffusing donor impurity material into the opposite side of each of said wafers, with said wafers havsaid impurity materials coated as thin layers on the respective sides thereof prior to the diffusion step, said process comprising:

(*a*) arranging said wafers in a stack on a holder such that adjacent wafers in said stack have the coatings containing the same impurity material in contact with each other, (*b*) sliding said wafers from said holder into a diffusion tube which has ribs extending lengthwise of the tube on the inner surface thereof such that said ribs receive and support said wafers at the edge portions thereof and maintain said wafers in a stack which extends longitudinally of said tube, (*c*) passing flushing gas through spaces between said ribs in said tube so that the flushing gas flows past and in contact with the edges of said wafers, (*d*) and heating said wafers in said tube to diffuse said impurities from said layers into said wafers while continuing said flow of flushing gas so that said flushing gas sweeps impurity vapors away from the edges of said wafers in order to minimize contamination of either side of said wafers with impurities vaporized from the other side thereof.

5. Diffusion apparatus for treating semiconductor wafers having one doping impurity material coated on one side thereof and having another doping impurity material coated on the opposite side thereof in order to simultaneously diffuse said impurities into said wafers with a minimum of cross contamination, said diffusion apparatus including in combination:

(*a*) a diffusion tube having a series of ribs extending longitudinally of said tube on the inside thereof for receiving and supporting said wafers at the edge portions thereof when said wafers are arranged in a stack extending along the axis of said tube, (*b*) said ribs forming passages between the same for gas to flow through said tube along the edges of said wafers when stacked therein, (*c*) means for supplying flushing gas to said passages at one end of said tube, (*d*) means forming an outlet for such flushing gas at the other end of said tube, (*e*) and means for supplying heat to the inside of said tube for causing said impurities to diffuse from said coatings into said wafers.

6. Diffusion apparatus for use in accomplishing the simultaneous diffusion of a first impurity material into one of the sides of each of semiconductor wafers and a different second impurity material into the opposite sides and in which each of said wafers have the different impurity materials coated on respective sides thereof, said apparatus including in combination:

(*a*) a tube having elongated ribs formed on the inner surface thereof and extending longitudinally of said tube, (*b*) said ribs being adapted to support a stack of said wafers at the edge portions of said wafers with the stack extending longitudinally of said tube, (*c*) and said ribs forming passages between the same for gas to flow through said tube past the edge portions of said wafers when stacked therein, (*d*) gas inlet means and gas outlet means for said tube for causing flushing gas to flow through said passages in said tube past the edge portions of said wafers when stacked therein, (*e*) and means for heating said wafers in said tube to diffuse said impurities into said wafers while passing flushing gas past the edges of said wafers in order to sweep away impurity vapors emanating from said wafers when heated in said tube.

References Cited by the Examiner

UNITED STATES PATENTS

| | | | |
|---|---|---|---|
| 2,804,405 | 8/57 | Derick et al. | 148—187 |
| 2,870,050 | 1/59 | Mueller et al. | 148—188 |
| 2,992,144 | 7/61 | Dehmelt | 148—190 |
| 3,003,900 | 10/61 | Levi | 148—191 |
| 3,007,820 | 11/61 | McNamara et al. | 148—191 |

DAVID L. RECK, *Examiner.*

BENJAMIN HENKIN, *Primary Examiner.*